(12) United States Patent
Huang et al.

(10) Patent No.: US 8,817,432 B2
(45) Date of Patent: Aug. 26, 2014

(54) POWER SWITCH EMBEDDED IN ESD PAD

(75) Inventors: Shao-Chang Huang, Hsinchu (TW);
Wei-Yao Lin, Hsinchu County (TW);
Tang-Lung Lee, Taipei County (TW);
Kun-Wei Chang, Taipei County (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 1449 days.

(21) Appl. No.: 12/499,046

(22) Filed: Jul. 7, 2009

(65) Prior Publication Data

US 2010/0259858 A1 Oct. 14, 2010

Related U.S. Application Data

(60) Provisional application No. 61/167,868, filed on Apr. 9, 2009.

(51) Int. Cl.
| | |
|---|---|
| *H02H 9/00* | (2006.01) |
| *G11C 16/30* | (2006.01) |
| *G11C 5/00* | (2006.01) |
| *H01C 7/12* | (2006.01) |
| *H02H 1/00* | (2006.01) |
| *H02H 1/04* | (2006.01) |
| *H02H 3/22* | (2006.01) |
| *H02H 9/06* | (2006.01) |

(52) U.S. Cl.
CPC .............. *G11C 16/30* (2013.01); *G11C 5/005* (2013.01)
USPC ............................................ 361/56; 361/118

(58) Field of Classification Search
USPC ............................................................. 361/56
See application file for complete search history.

(56) References Cited

U.S. PATENT DOCUMENTS

| | | | |
|---|---|---|---|
| 6,323,704 B1 * | 11/2001 | Pelley et al. ................... | 327/112 |
| 6,586,974 B1 * | 7/2003 | Humphrey et al. ............ | 327/108 |
| 7,683,667 B2 * | 3/2010 | Kim ................................. | 326/63 |
| 7,804,334 B2 * | 9/2010 | Shankar et al. ................ | 327/77 |
| 2006/0044718 A1 * | 3/2006 | Su et al. ........................... | 361/56 |

FOREIGN PATENT DOCUMENTS

| | | |
|---|---|---|
| TW | 200307950 | 12/2003 |
| TW | 200633385 | 9/2006 |
| TW | I286835 | 9/2007 |

\* cited by examiner

*Primary Examiner* — Dharti Patel
(74) *Attorney, Agent, or Firm* — Winston Hsu; Scott Margo

(57) ABSTRACT

A driver circuit has a pad that may be utilized for programming a core circuit or receiving a data signal. A trace high circuit receives a pad voltage signal from the pad, and outputs a trace high voltage approximating a higher voltage of the pad voltage signal and the power supply voltage. A level shifter and a first inverter output a pull high control signal generated by inverting and level shifting a programming control signal. An ESD blocking circuit selectively blocks the pad voltage signal from reaching the core circuit depending on the pad voltage signal and the level-shifted programming control signal. A pull high circuit receives the pull high control signal and the power supply voltage, and outputs the power supply voltage to the core circuit when the pull high control signal is lower than the power supply voltage.

8 Claims, 6 Drawing Sheets

POWER SWITCH EMBEDDED IN ESD PAD

CROSS REFERENCE TO RELATED APPLICATIONS

This application claims the benefit of U.S. Provisional Application No. 61/167,868, filed on Apr. 9, 2009 and entitled "Power Switch Embedded in ESD PAD," the contents of which are incorporated herein by reference.

BACKGROUND OF THE INVENTION

1. Field of the Invention

The present invention relates to ESD protection circuits, and more particularly to a power switch embedded in an ESD pad.

2. Description of the Prior Art

Flash memory is a type of non-volatile memory commonly employed in memory cards, flash drives, and portable electronics for providing data storage and transfer. Flash memory may be electrically written to, erased, and reprogrammed to allow deletion of data and writing of new data. Some advantages of flash memory include fast read access time, and shock resistance. Flash memory is also very resistant to pressure and temperature variations.

Please refer to FIG. 1, which is a diagram of a flash memory circuit 10. The flash memory circuit 10 includes a plurality of flash memory blocks 100 that are programmable through a programming voltage VPP applied at a pad VPP_PAD. A gate driving circuit 110 drives gate terminals of a first transistor 131 and a second transistor 132 of a pass gate 130 to allow the programming voltage VPP to be sent to the flash memory blocks 100. When the programming voltage VPP is applied at the pad VPP_PAD, the programming voltage VPP is received by an inverter 120 through a resistor R at a node G2. The inverter 120 comprises a pull-up transistor MP, and a pull-down transistor MN. The programming voltage is also applied to a gate terminal of the first transistor 131 of the pass gate, and the pull-down transistor MN is turned on by the pad voltage to pull down voltage applied to a gate terminal of the second transistor 132 of the pass gate 130. Thus, the pass gate 130 turns on, and the programming voltage VPP may be sent to the flash memory blocks 100.

Electrostatic discharge (ESD) entering the flash memory circuit 10 through the pad VPP_PAD is one potential source of damage to the flash memory blocks 100. To mitigate the ESD effect, one goal is to direct excess charges to a lower potential node, such as a node VSS. The flash memory circuit 10 thus further comprises an ESD transistor M_ESD for redirecting ESD current away from the flash memory blocks 100. When the voltage applied to the pad VPP_PAD goes high, a gate terminal of the ESD transistor M_ESD is temporarily pulled high at a node G1 through the second transistor MP, because a MOS capacitor NC and a resistor R keep gates of the first transistor MN and the second transistor MP low while the MOS capacitor NC is charged by the ESD charges. ESD zapping typically occurs for a period on the order of nanoseconds. Thus, the resistor R and the MOS capacitor NC may be designed with a RC time constant of approximately 1 us to keep the ESD transistor M_ESD turned on long enough to redirect most or all of the ESD current. One disadvantage of the flash memory circuit 10 is that the pad VPP_PAD cannot be utilized as an I/O pad.

SUMMARY OF THE INVENTION

According to one embodiment, a driver circuit for driving a core circuit comprises a pad for receiving a pad voltage signal, a trace high circuit, a level shifter, a first inverter, an ESD blocking circuit, and a pull high circuit. The trace high circuit has a first input terminal coupled to the pad for receiving the pad voltage signal, the trace high circuit further has a second input terminal for receiving a power supply voltage, and an output terminal for outputting a trace high voltage approximating a higher voltage of the pad voltage signal and the power supply voltage. The level shifter has a first input terminal coupled to the output terminal of the trace high circuit for receiving the trace high voltage, a second input terminal for receiving a programming control signal, and an output terminal for outputting a level-shifted programming control signal generated by level shifting the programming control signal according to the trace high voltage. The first inverter has a first input terminal coupled to the trace high circuit for receiving the trace high voltage, a second input terminal coupled to the output terminal of the level shifter, and an output terminal for outputting a pull high control signal generated by inverting the level-shifted programming control signal. The ESD blocking circuit is coupled to the level shifter, the pad, and the core circuit. The ESD blocking circuit comprises a first transistor comprising an input terminal coupled to the pad for receiving the pad voltage signal, an output terminal, and a control terminal for receiving the level-shifted programming control signal. The control terminal of the first transistor controls the ESD blocking circuit to block the pad voltage signal from reaching the core circuit when the pad voltage signal is not for programming, and to allow the pad voltage signal to reach the core circuit when the pad voltage signal is for programming. The pull high circuit is coupled to the first inverter and the core circuit for receiving the pull high control signal and the power supply voltage, and outputting the power supply voltage to the core circuit when the pull high control signal is lower than the power supply voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
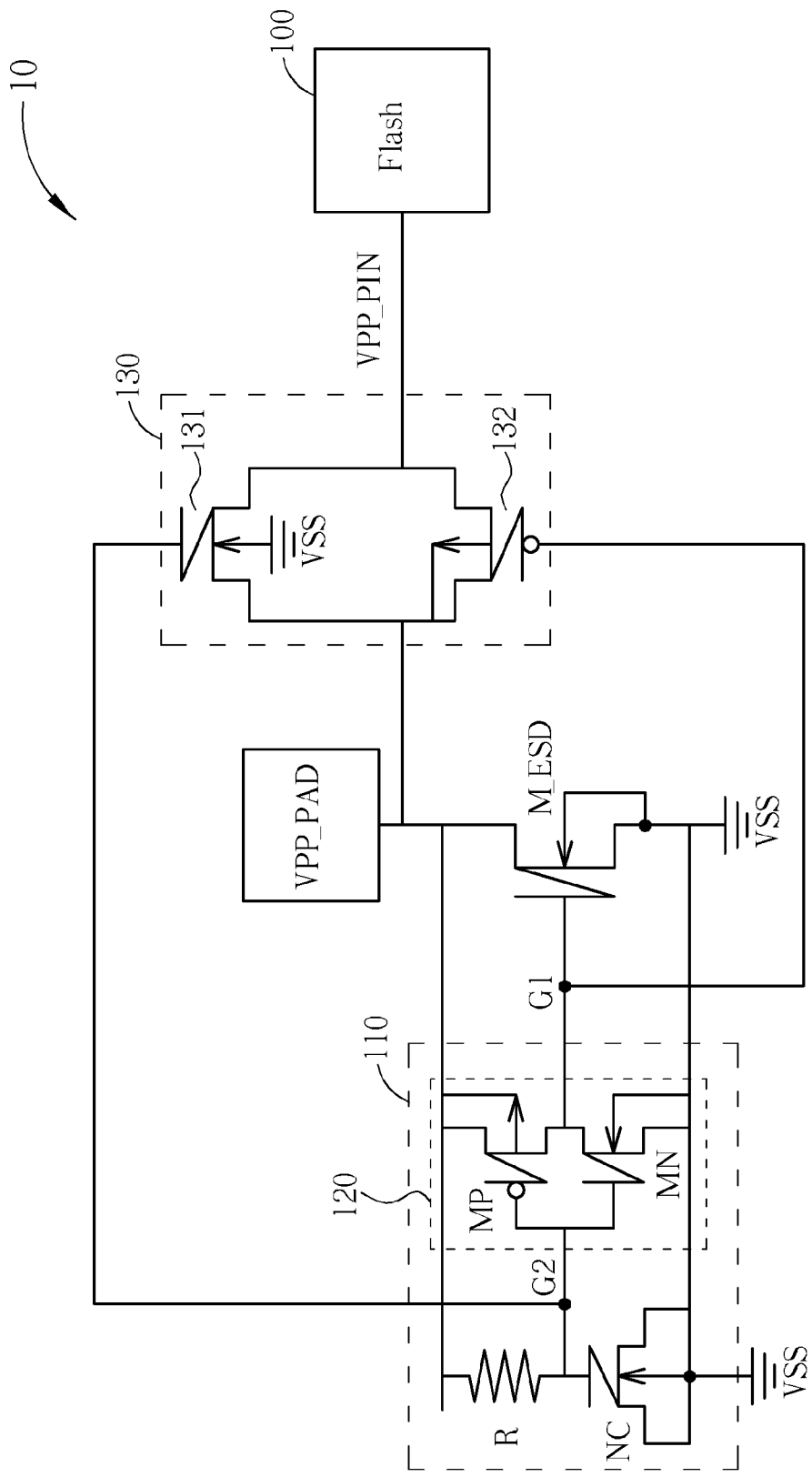
FIG. 1 is a diagram of a flash memory circuit according to the prior art.

FIGS. 2-5 illustrate exemplary techniques for utilizing a power switch embedded in an ESD pad in a memory driving circuit. The use of the same reference numerals/symbols in different figures indicates similar or identical items.

Figure 2:
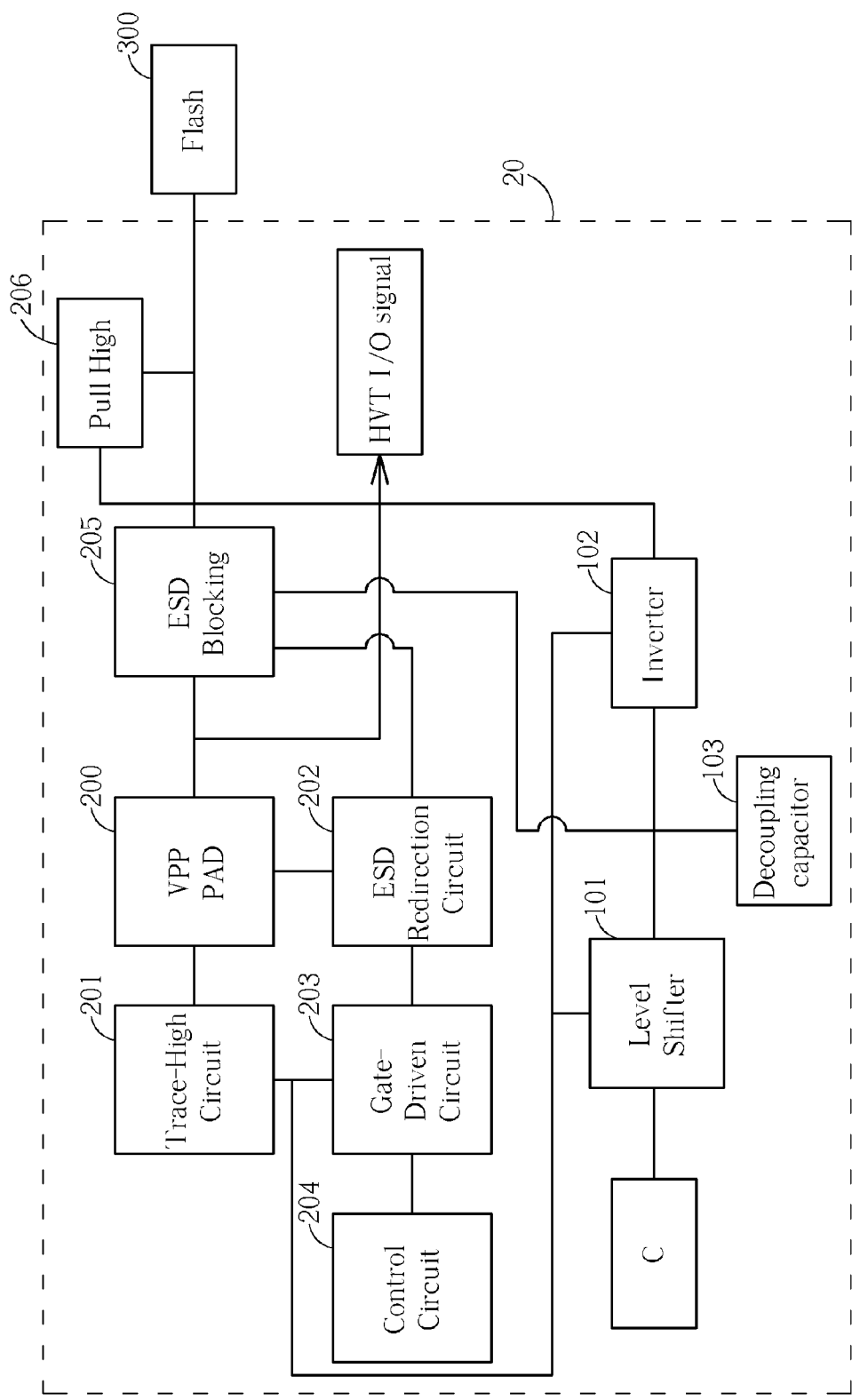
FIG. 2 is a block diagram of a driver circuit according to one embodiment of the present disclosure.
Figure 3:
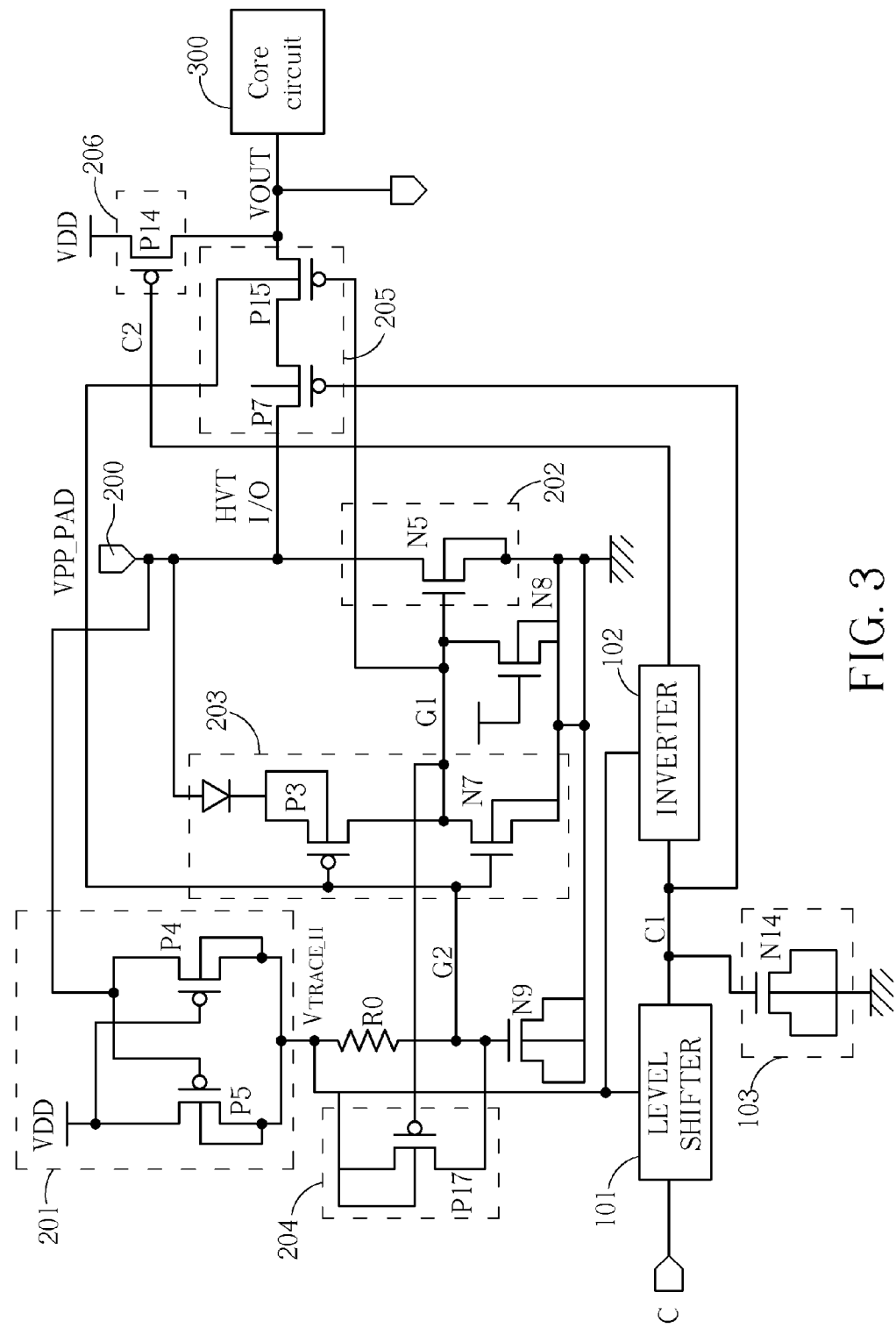
FIG. 3 is a circuit diagram of the driver circuit of FIG. 2.

Referring to FIG. 2 and FIG. 3, an exemplary driver circuit 20 is illustrated in accordance with at least one embodiment of the present disclosure. The driver circuit 20 may be implemented as an integrated device, an ASIC, or a plurality of integrated circuits.

As shown in FIG. 2, the driver circuit 20 may be utilized for driving a core circuit 300, such as a memory cell, or other drivable circuit. The driver circuit 20 may include a pad VPP_PAD for receiving a pad voltage signal $V_{PAD}$. The pad VPP_PAD may provide a programming voltage VPP for programming the core circuit 300, or may also provide an HVT I/O signal when no programming occurs. In other words, the pad voltage signal $V_{PAD}$ may be a programming voltage VPP or a data signal. The driver circuit 20 may further include a level shifter 101 for shifting level of a programming control signal C received at an input terminal of the level shifter 101, and a first inverter 102 for inverting the level-shifted programming control signal C1 outputted by an output terminal of the level shifter 101 to generate a pull high control signal C2. The first inverter 102 may comprise a first input terminal for receiving the trace high voltage $V_{TRACE\_H}$, a second input terminal for receiving the level-shifted control signal C1, and an output terminal for outputting the pull high control signal C2. The driver circuit 20 may further comprise a pull high circuit 206 having a control terminal coupled to an output terminal of the first inverter 102 for receiving the pull high control signal C2, and an output terminal for pulling up output voltage VOUT of the driver circuit 20. The pull high circuit 206 may comprise a P-type MOS (PMOS) transistor P14 having a gate coupled to the output terminal of the first inverter 102, a source terminal for receiving a power supply voltage VDD, e.g. 3.3V, and a drain terminal for pulling up the output voltage VOUT of the driver circuit 20, e.g. outputting the power supply voltage VDD to the core circuit 300. The driver circuit 20 may also include a trace high circuit 201 having a first input terminal for receiving the pad voltage signal $V_{PAD}$, and an output terminal for outputting a corresponding trace high signal $V_{TRACE\_H}$ to the level shifter 101 and the first inverter 102. The trace high circuit 201 may comprise a first PMOS transistor P4 and a second PMOS transistor P5. The first PMOS transistor P4 may have a gate for receiving the power supply voltage VDD, a source coupled to the pad VPP_PAD for receiving the pad voltage signal $V_{PAD}$, and a drain for outputting the trace high signal $V_{TRACE\_H}$. The second PMOS transistor P5 may have a gate coupled to the pad VPP_PAD for receiving the pad voltage signal $V_{PAD}$, a source for receiving the power supply voltage VDD, and a drain for outputting the trace high signal $V_{TRACE\_H}$.

In addition to the above, the driver circuit 20 may also include ESD protection circuitry, described as follows. ESD charges may enter the driver circuit 20 through the pad VPP_PAD, and have potential to damage the core circuit 300, as well as circuits of the driver circuit 20. To prevent the ESD charges from causing damage, the driver circuit 20 may include an ESD redirection circuit 202 and an ESD blocking circuit 205. The ESD redirection circuit 202 may be controlled by gate driven circuit 203, which may comprise a second inverter, for directing the ESD charges to ground. The ESD redirection circuit 202 may comprise an N-type MOS (NMOS) transistor N5 having a gate coupled to an output terminal of the gate driven circuit 203, a source coupled to ground, and a drain coupled to the pad VPP_PAD for receiving the pad voltage signal $V_{PAD}$. The gate driven circuit 203 may comprise an NMOS transistor N7, a PMOS transistor P3, and a diode D0. The NMOS transistor N7 may have a gate coupled to a control node G2 for receiving trace high signal $V_{TRACE\_H}$ through a resistor R0 and a control circuit 204, a source coupled to ground, and a drain coupled to an ESD control node G1. The PMOS transistor P3 may have a gate coupled to the control node G2 for receiving trace high signal $V_{TRACE\_H}$ through the resistor R0 and the control circuit 204, a source coupled to a cathode of the diode D0, and a drain coupled to the ESD control node G1. The diode D0 has an anode coupled to the pad VPP_PAD. The control circuit 204 may comprise a PMOS transistor P17 having a gate coupled to the ESD control node G1, a source coupled to the drains of the first and second PMOS transistors P4, P5 of the trace high circuit 201, and a drain coupled to the control node G2. The ESD blocking circuit 205 may act to decouple the core circuit 300 from the driving circuit 20 during an ESD event, and may comprise a first PMOS transistor P7 and a second PMOS transistor P15. The first PMOS transistor P7 may have a gate coupled to the output terminal of the level shifter 101 for receiving the level-shifted programming control signal C1, a drain coupled to a source of the second PMOS transistor P15, and a source coupled to the pad VPP_PAD. The second PMOS transistor P15 may have a gate coupled to the ESD control node G1, a drain coupled to the core circuit 300 for outputting the output voltage VOUT, and the source coupled to the drain of the first PMOS transistor P7. The driver circuit 20 may further comprise a decoupling capacitor 103 coupled from the output terminal of the level shifter 101 to ground for protecting the driver circuit 20 and the core circuit 300 during a "VDD-to-ground" ESD zap.

Figure 4:
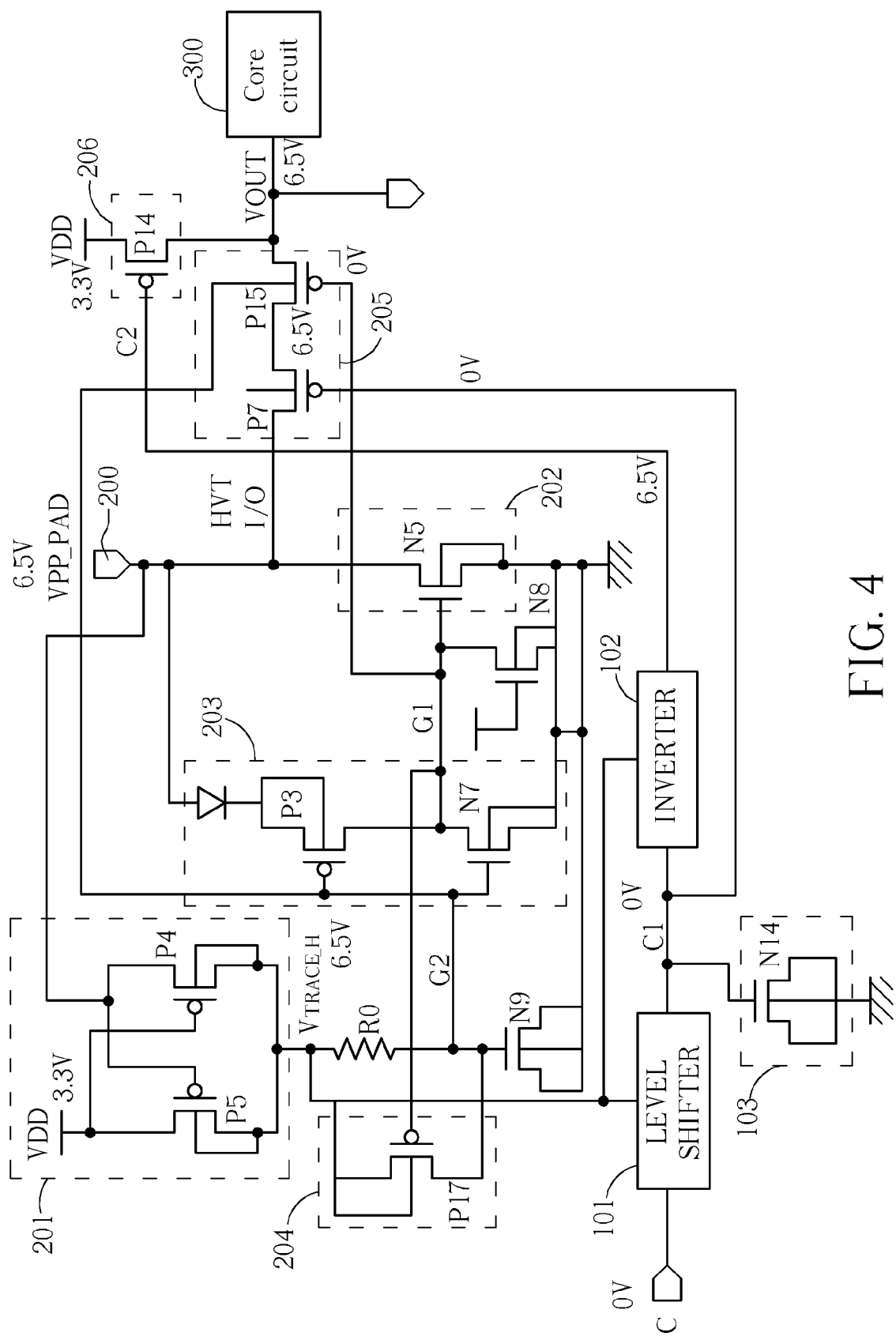
FIG. 4 is a diagram of the driver circuit of FIG. 3 in programming mode.

Please refer to FIG. 4, which is a diagram of the driver circuit 20 and the core circuit 300 in programming mode. In programming mode, the pad voltage signal $V_{PAD}$ may charge control node G2, which may increase input voltage to the gate driven circuit 203, decreasing output voltage of the gate driven circuit 203 at ESD control node G1. The lowered output voltage turns off the ESD redirection circuit 202, and turns on an ESD blocking transistor P15 of the ESD blocking device 205, so as to allow the programming voltage VPP to reach the core circuit 300. Further, in programming mode, the programming control signal C is at a programming state voltage, e.g. 0V, and the pad voltage signal $V_{PAD}$ may be the programming voltage VPP, e.g. 6.5V. Thus, the trace high voltage $V_{TRACE\_H}$ may be approximately the programming voltage VPP, as the first PMOS transistor P4 of the trace high circuit 201 is turned on, and the second PMOS transistor P5 of the trace high circuit 201 is turned off. The level shifter 101 may shift the programming control signal C to a level shift down voltage, e.g. 0V or lower, and the first inverter 102 may invert the level-shifted programming control signal C1 to the trace high voltage $V_{TRACE\_H}$, e.g. 6.5V. The gate of the first PMOS transistor P7 of the ESD blocking circuit 205 receives the level-shifted programming control signal C1, e.g. 0V, which turns on the first PMOS transistor P7 of the ESD blocking circuit 205, allowing the pad voltage signal $V_{PAD}$ to reach the core circuit 300. The pull high control signal C2 outputted by the first inverter 102, e.g. 6.5V, turns off the PMOS transistor P14 of the pull high circuit 206. The ESD control node G1 may be at a lower voltage than the trace high signal $V_{TRACE\_H}$, thereby turning on the PMOS transistor P17 of the control circuit 204, effectively shorting out the resistor R0.

Figure 5:
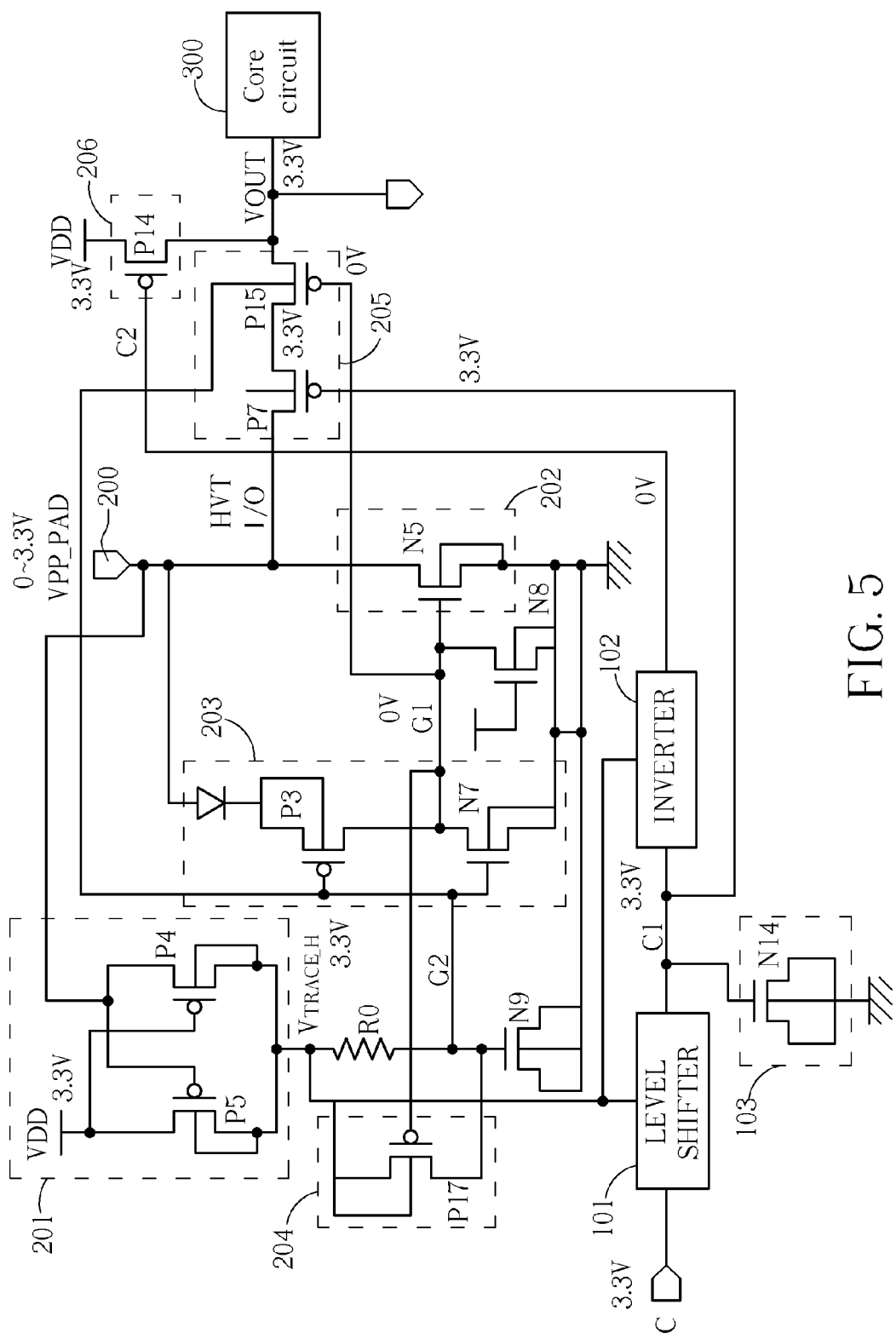
FIG. 5 is a diagram of the driver circuit of FIG. 3 in I/O mode.

Referring to FIG. 5, in I/O mode, the pad voltage signal $V_{PAD}$ may be a data signal which transmits data using voltages ranging from, for example, 0V to 3.3V. In I/O mode, the programming control signal C is at a non-programming state voltage, e.g. 3.3V. Thus, the trace high voltage $V_{TRACE\_H}$ may approximate the power supply voltage VDD, e.g. 3.3V, as the second PMOS transistor P5 of the trace high circuit 201 may be turned on. The programming control signal C may be level shifted up to a level shift up voltage approximating the trace high voltage $V_{TRACE\_H}$. Then, the first inverter 102 may invert the level-shifted programming control signal C1 outputted by the level shifter 101 to generate the pull high control signal C2 at a low voltage, e.g. 0V. The pull high control signal C2 may be received by the PMOS transistor P14 of the pull high circuit 206, which may turn on the PMOS transistor P14, pulling up the output voltage VOUT to approximately the power supply voltage VDD. The trace high voltage $V_{TRACE\_H}$ may also be sent to the node G2 through the resistor R0 and the control circuit 204, such that the gate driven circuit 203 may output a low voltage, e.g. 0V, to the gate of the ESD redirection circuit 202, turning off the NMOS transistor N5 of the ESD redirection circuit 202. The low voltage outputted by the gate driven circuit 203 may also be received by the second PMOS transistor P15 of the ESD blocking circuit 205. Thus, the core circuit 300 only receives the power supply voltage VDD, and the core circuit 300 may be isolated from the data signal transmitted through the pad VPP_PAD. In this way, the pad VPP_PAD may be utilized not only for programming the core circuit 300, but also as an I/O pad when not in the programming mode. In the I/O mode, the PMOS transistor P17 of the control circuit 204 may be turned on, as the low voltage at the node G1 is received by the gate of the PMOS transistor P17, and the trace high voltage $V_{TRACE\_H}$ is received at the source of the PMOS transistor P17.

Figure 6:
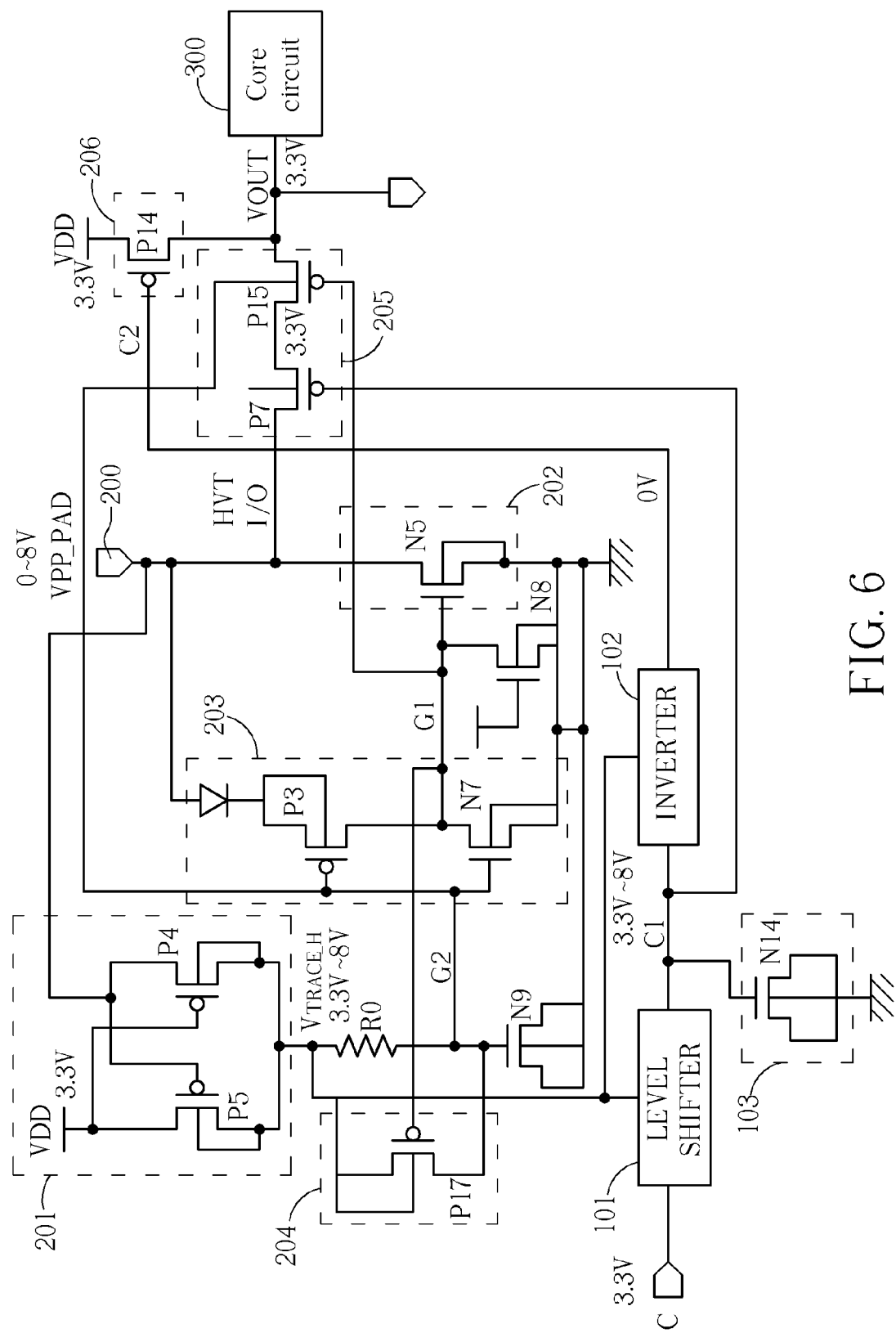
FIG. 6 is a diagram of the driver circuit of FIG. 3 in latch-up mode.

Referring to FIG. 6, in latch-up mode, noise may push the driver circuit 20 into a latch-up condition, in which the pad voltage signal $V_{PAD}$ may vary from a low voltage, e.g. 0V, to a latch-up voltage, e.g. 8V. In this situation, the trace high voltage $V_{TRACE\_H}$ may vary from the power supply voltage VDD to the latch-up voltage. If the pad voltage signal $V_{PAD}$ is lower than the power supply voltage VDD, the trace high voltage $V_{TRACE\_H}$ may approximate the power supply voltage VDD. On the other hand, if the pad voltage signal $V_{PAD}$ is higher than the power supply voltage VDD, the trace high voltage $V_{TRACE\_H}$ may approximate the pad voltage signal $V_{PAD}$. Thus, for example, the trace high voltage $V_{TRACE\_H}$ may vary from approximately 3.3V to 8V. Likewise, the level-shifted programming control signal C1 outputted by the level shifter 101 may vary from approximately the power supply voltage VDD to the latch-up voltage, e.g. approximately 3.3V to 8V. Thus, the first PMOS transistor P7 of the ESD blocking circuit 205 may be turned off, thereby approximately isolating the core circuit 300 from the driving circuit 20. The first inverter 102 may output the low voltage, e.g. 0V, to the pull high circuit 206, thereby turning on the PMOS transistor P14 to pull up the output voltage VOUT to the power supply voltage VDD. The trace high voltage $V_{TRACE\_H}$ may be received by the gate driven circuit 203, which may then output the low voltage to the ESD redirection circuit 202 and the second PMOS transistor P15 of the ESD blocking circuit 205. The PMOS transistor P17 of the control circuit 204 may be turned on, as the low voltage at the node G1 is received by the gate of the PMOS transistor P17, and the trace high voltage $V_{TRACE\_H}$ is received at the source of the PMOS transistor P17.

The driving circuit 20 utilizes the trace high circuit 201, the ESD blocking circuit 205, and the programming control signal C to prevent ESD charges and high voltages other than the programming voltage VPP from reaching the core circuit 300 being driven by the driving circuit 20. This allows the pad VPP_PAD to be utilized not only for programming the core circuit 300, but also as a data I/O pad available for use in other applications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driver circuit for driving a core circuit, the driver circuit comprising:
   a pad for receiving a pad voltage signal;
   a trace high circuit having a first input terminal coupled to the pad for receiving the pad voltage signal, the trace high circuit further having a second input terminal for receiving a power supply voltage, and an output terminal for outputting a trace high voltage approximating a higher voltage of the pad voltage signal and the power supply voltage;
   a level shifter having a first input terminal coupled to the output terminal of the trace high circuit for receiving the trace high voltage, a second input terminal for receiving a programming control signal, and an output terminal for outputting a level-shifted programming control signal generated by level shifting the programming control signal according to the trace high voltage;
   a first inverter having a first input terminal coupled to the trace high circuit for receiving the trace high voltage, a second input terminal coupled to the output terminal of the level shifter, and an output terminal for outputting a pull high control signal generated by inverting the level-shifted programming control signal;
   an ESD blocking circuit coupled to the level shifter, the pad, and the core circuit, the ESD blocking circuit comprising:
      a first transistor comprising:
         an input terminal coupled to the pad for receiving the pad voltage signal;
         an output terminal; and
         a control terminal for receiving the level-shifted programming control signal, the control terminal controlling the ESD blocking circuit to block the pad voltage signal from reaching the core circuit when the pad voltage signal is not for programming, and to allow the pad voltage signal to reach the core circuit when the pad voltage signal is for programming; and
   a pull high circuit coupled to the first inverter and the core circuit for receiving the pull high control signal and the power supply voltage, and outputting the power supply voltage to the core circuit when the pull high control signal is lower than the power supply voltage.

2. The driver circuit of claim 1, further comprising:
   an ESD redirection circuit coupled to the pad for receiving the pad voltage signal and an ESD control node for draining ESD charges to ground when voltage of the ESD control node is higher than ground.

3. The driver circuit of claim 2, further comprising:
   a resistor having a first terminal coupled to an output terminal of the trace high circuit for receiving the trace high voltage, and a second terminal coupled to a control node; and
   a gate driven circuit coupled to the control node and the ESD redirection circuit for outputting the voltage of the ESD control node as an inverse of approximately the trace high voltage.

4. The driver circuit of claim 3, wherein the gate driven circuit comprises a second inverter for receiving the trace high voltage, outputting a low voltage when the trace high voltage is high, and outputting a high voltage when the trace high voltage is low.

5. The driver circuit of claim 2, further comprising:
   a control circuit comprising:
      an input terminal coupled to the trace high circuit for receiving the trace high voltage;

an output terminal coupled to the control node; and a control terminal coupled to the ESD control node for shorting the resistor when voltage of the ESD control node is lower than the trace high voltage.

6. The driver circuit of claim 2, further comprising:

a decoupling capacitor having a first terminal coupled to the output terminal of the level shifter and a second terminal coupled to ground.

7. The driver circuit of claim 2, wherein the ESD blocking circuit further comprises:

a second transistor comprising:

an input terminal coupled to the output terminal of the first transistor;

an output terminal coupled to the core circuit; and a control terminal coupled to the ESD control node for controlling the ESD blocking circuit to block the pad voltage signal from reaching the core circuit when the pad voltage signal is not for programming, and to allow the pad voltage signal to reach the core circuit when the pad voltage signal is for programming.

8. The driver circuit of claim 2, wherein the trace high circuit comprises:

a first transistor comprising:

an input terminal coupled to the pad for receiving the pad voltage signal;

an output terminal for outputting the trace high voltage; and a control terminal for receiving the power supply voltage for controlling the output terminal to output the pad voltage signal as the trace high voltage when the power supply voltage is lower than the pad voltage signal;

a second transistor comprising:

an input terminal for receiving the power supply voltage;

an output terminal for outputting the trace high voltage; and a control terminal coupled to the pad for receiving the pad voltage signal for controlling the output terminal to output the power supply voltage as the trace high voltage when the pad voltage signal is lower than the power supply voltage.

* * * * *